(12) United States Patent
Barthel

(10) Patent No.: US 11,131,704 B2
(45) Date of Patent: Sep. 28, 2021

(54) METHOD AND MEASURING APPARATUS FOR TESTING A DEVICE UNDER TEST

(71) Applicant: Rohde & Schwarz GmbH & Co. KG, Munich (DE)

(72) Inventor: Sven Barthel, Chemnitz (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 59 days.

(21) Appl. No.: 16/364,809

(22) Filed: Mar. 26, 2019

(65) Prior Publication Data

US 2020/0309846 A1 Oct. 1, 2020

(51) Int. Cl.
*G01R 31/28* (2006.01)
*G06F 17/18* (2006.01)
(Continued)

(52) U.S. Cl.
CPC ......... *G01R 31/2837* (2013.01); *G01R 23/14* (2013.01); *G01R 31/2879* (2013.01); *G06F 17/18* (2013.01)

(58) Field of Classification Search
CPC . B23K 20/00; C25D 5/00; G01D 5/00; G01D 3/00; G01K 3/00; G01K 1/00; G01K 5/00; G01K 7/00; G01K 11/00; G01K 15/00; G01K 2219/00; G01Q 60/00; G01Q 10/00; G01Q 70/00; G01R 1/00; G01R 3/00; G01R 23/00; G01R 27/00; G01R 29/00; G01R 31/00; G01R 35/00; G01R 15/00; G01R 19/00; G01R 22/00; G01R 33/00; G01R 31/2837; G01R 31/2879; G01R 23/14; G01R 27/32; G01R 31/2841; G01R 23/163; G06F 17/00; G06F 3/00;
(Continued)

(56) References Cited

U.S. PATENT DOCUMENTS 4,539,518 A * 9/1985 Kitayoshi .............. G01R 23/16
324/76.15
5,524,281 A * 6/1996 Bradley ................. G01R 27/28
324/601
(Continued)

OTHER PUBLICATIONS

Tek Sampling Oscilloscopes, Technique Primer 47W-7209, "Sampling Oscilloscope Techniques", Tektronix®, Oct. 1989 10M, 4 pages.
(Continued)

*Primary Examiner* — Melissa J Koval
*Assistant Examiner* — Joseph O Nyamogo
(74) *Attorney, Agent, or Firm* — Westman, Champlin & Koehler, P.A.

(57) ABSTRACT

The present invention relates to a method and a measuring apparatus for testing a device under test. A measuring apparatus applies a first test signal to the device under test and measures at least one frequency response parameter of the device under test for a first plurality of frequency values lying in a first frequency range. The measuring apparatus applies a second test signal to the device under test and measures the at least one frequency response parameter of the device under test for a second plurality of frequency values lying in a second frequency range. The first frequency range at least partially overlaps with the second frequency range and the first plurality of frequency values at least partially differs from the second plurality of frequency values.

10 Claims, 4 Drawing Sheets

(51) Int. Cl.
*G01R 27/32* (2006.01)
*G01R 23/163* (2006.01)
*G01R 23/14* (2006.01)

(58) Field of Classification Search
CPC .......... G06F 17/18; H01F 17/00; H01F 27/00;
H01F 2017/00; H01F 2021/00; H01L
22/00; H01L 23/00; H01L 24/00; H01L
25/00; H01L 27/00; H01L 29/00; H01L
2223/00; H01L 2224/00; H01L 2924/00;
H01R 9/00; H01R 12/00; H02M 1/00;
H02M 3/00; H02M 7/00; H02M 2001/00;
H02M 2003/00; H02P 5/00; H03B 5/00;
H03D 3/00; H03D 7/00; H03F 1/00;
H03F 3/00; H03F 2200/00; H03F
2203/00; H03G 1/00; H03G 3/00; H03H
7/00; H03H 11/00; H03H 19/00; H03J
1/00; H03J 3/00; H03J 2200/00; H05K
3/00; H05K 1/00; H05K 7/00; H05K
2201/00; H03L 7/00; H03L 2207/00;
H04L 27/00; H04R 3/00; H04R 29/00;
Y02B 70/00; Y02P 70/00; Y10T 29/00;
Y10T 307/00; G01B 5/00; G01B 7/00;
G01B 17/00; G01B 21/00; G01H 9/00;
G01H 11/00; G01J 1/00; G01J 3/00;
G01J 5/00; G01L 1/00; G01L 5/00; G01L
9/00; G01L 21/00; G01M 3/00; G01M
5/00; G01M 13/00; G01M 15/00; G01N
2291/00; G01N 3/00; G01N 5/00; G01N
9/00; G01N 17/00; G01N 21/00; G01N
22/00; G01N 23/00; G01N 24/00; G01N
25/00; G01N 27/00; G01N 29/00; G01N
31/00; G01N 33/00; G01N 2021/00;
G01P 3/00; G01S 5/00; G01S 13/00;
G01V 3/00; G02B 1/00; G02B 6/00;
G02B 2006/00; G02F 1/00; G02F 2/00;
G02F 2001/00; G02F 2201/00; G02F
2202/00; G02F 2203/00; G03G 15/00;
G03H 1/00; G03H 2001/00; G03H
2226/00; G04F 5/00; G05D 23/00; G05F
3/00; G06K 7/00; G06K 9/00; G06N
3/00; G06N 10/00; G06N 20/00; G06T
5/00; G06T 7/00; G06T 11/00; G06T
2207/00; G06T 2211/00; G07C 9/00;
G08B 17/00; G08B 21/00; G08B 29/00;
G09G 3/00; G09G 2300/00; G09G
2320/00; G09G 2330/00; G09G 2360/00;
G09G 2370/00; G11B 9/00; G11C 11/00;
G11C 13/00; G21K 1/00
See application file for complete search history.

(56) References Cited

U.S. PATENT DOCUMENTS

| 7,919,969 | B2 | 4/2011 | Held | |
|---|---|---|---|---|
| 2007/0194776 | A1* | 8/2007 | Bossche | G01R 27/28 324/76.22 |
| 2009/0267616 | A1* | 10/2009 | Berlin | G01R 27/28 324/638 |
| 2012/0161749 | A1* | 6/2012 | Sternberg | H04B 17/21 324/76.23 |

OTHER PUBLICATIONS

R&S® ZVA / R&S® ZVB / R&S® ZVT Vector Network Analyzers Operating Manual, Rohde & Schwarz, Operating Manual 1145. 1084.12, Version 31, 1181 pages.

* cited by examiner

METHOD AND MEASURING APPARATUS FOR TESTING A DEVICE UNDER TEST

TECHNICAL FIELD

The present invention relates to a method for testing a device under test. The invention further relates to a measuring apparatus for testing a device under test. In particular, the present invention relates to a network analysis method and a corresponding measuring apparatus.

BACKGROUND

After the production of electronic devices, it is necessary to perform tests in order to make sure that the electronic devices are working properly. Reliable functionality is of utmost importance in safety relevant fields, such as for automotive, defense-related or medical applications. Generally, any type of active electronic components, such as amplifiers or communication devices, or passive electronic components including filtering elements, cables, resistance elements, capacitances or inductances can be tested.

The required tests are performed under predetermined conditions and may be performed during normal operation of the electronic devices. The device under test (DUT) is connected to a measuring apparatus which may send predefined test signals to the device under test. The device under test responds to the test signal and the measuring apparatus measures and analyzes the response. The test may be performed by analyzing the response within a certain range of frequencies. For example, document U.S. Pat. No. 7,919,969 B2 discloses a network analyzer having a signal generator which sweeps through a given frequency range to analyze a test object.

The analysis of increasingly complex electronic equipment is very time-consuming and costly and has therefore the tendency to slow down manufacturing processes. For example, testing devices at low frequencies with an oscilloscope requires measurements over several periods. Required steps comprise adjusting of the frequency of the generator of the oscilloscope, controlling the amplitude of the test signals, controlling the analog-digital-converter (ADC) and providing anti-clipping-control. Therefore, given that several adjustments must be made during measurements, improvements of sweep generators taken alone are generally not sufficient to provide an analysis of DUTs which is fast enough to cope with the increasing demands of modern manufacturing of electronic equipment as mass products.

Therefore, solutions are sought for which can improve the testing speed in order to reduce the required costs of electronic equipment.

SUMMARY

The present invention solves this problem by the features of the independent claims. Further embodiments are subject matter of the dependent claims.

According to a first aspect, a method for testing a device under test is provided, in particular a network analysis method. A first test signal is applied by a measuring apparatus to the device under test. At least one frequency response parameter of the device under test is measured by the measuring apparatus for a first plurality of frequency values lying in a first frequency range. A second test signal is applied to the device under test by the measuring apparatus. The at least one frequency response parameter of the device under test is measured by the measuring apparatus for a second plurality of frequency values lying in a second frequency range. The first frequency range at least partially overlaps with the second frequency range. The first plurality of frequency values at least partially differs from the second plurality of frequency values.

According to a second aspect, the invention provides a measuring apparatus for testing a device under test which comprises a signal generating unit and a receiving unit. The signal generating unit generates a plurality of test signals and applies the plurality of test signals in consecutive order to the device under test. The receiving unit receives in response of the device under test to each of the plurality of test signals at least one frequency response parameter of the device under test for pluralities of frequency values corresponding to the respective test signal. Each plurality of frequency values is lying in a respective frequency range. The frequency ranges corresponding to the plurality of test signals at least partially overlap with each other. The plurality of frequency values corresponding to the plurality of test signals differ at least partially from each other. In particular, the signal generating unit may be adapted to generate a first test signal and a second test signal.

The invention proposes to test the device under test in several steps by sweeping a frequency range. After a first sweep, an estimation of the frequency dependence of the frequency response parameter can be obtained rather quickly over the whole frequency range. After a second sweep, additional measurements are added in order to improve the resolution of the measurement. The first frequency range overlaps at least partially with the second frequency range such that at least some of the frequency values obtained during the second sweep are between frequency values already obtained during the first sweep. Accordingly, the invention can provide quickly visualized and precise measurement plots.

According to a preferred embodiment of the method, the second plurality of frequency values corresponds to the first plurality of frequency values offset by a predetermined frequency offset value. In other words, each frequency value of the second plurality of frequency values is equal to the sum of a frequency value of the first plurality of frequency values and the predetermined frequency offset value.

According to a preferred embodiment of the method, the predetermined frequency offset value is smaller than the smallest difference between two adjacent frequency values of the first plurality of frequency values. This choice of the predetermined frequency offset value guarantees that between each frequency values of the first plurality of frequency values there is exactly one frequency value of the second plurality of frequency values. The resolution of the frequency dependence of the at least one frequency response parameter is thereby enhanced.

According to a preferred embodiment of the method, the frequency offset value is a fixed predetermined number independent of the frequency. However, the frequency offset value may also depend on the frequency, i.e. be a predetermined, nontrivial function of the frequency. For example, if the first plurality of frequency values is distributed according to a predetermined distribution, in particular a logarithmic spacing, the frequency offset value may also follow the same distribution, in particular may also scale logarithmically.

According to a preferred embodiment of the method, for each adjacent pair of frequency values of the first plurality of frequency values, a corresponding frequency value of the second plurality of frequency values is selected in the middle between the adjacent pair of frequency values. The frequency value of the second plurality of frequency values may be chosen as the mean value of the adjacent pair of frequency values of the first plurality of frequency values. The frequency value of the second plurality of frequency values may also be chosen according to the distribution of the first plurality of frequency values. For instance, the frequency value of the second plurality of frequency values may be chosen to be in the center between the adjacent pair of frequency values of the first plurality of frequency values on a logarithmic scale.

According to a preferred embodiment of the method, the measuring apparatus further applies at least one further test signal to the device under test. The measuring apparatus measures the at least one frequency response parameter of the device under test for at least one further plurality of frequency values lying in at least one further frequency range. Each of the first, second and at least one further frequency ranges at least partially overlap with each other. The first, second and at least one further plurality of frequency values at least partially differ from each other. Generally speaking, a predetermined frequency range may be swept several times, wherein each time at least one frequency response parameter corresponding to at least partially different sets of frequency values is measured. After each frequency sweep, the resolution of the obtained frequency dependence of the frequency response parameter increases.

According to a preferred embodiment of the method, the measuring apparatus applies further test signals and measures the corresponding at least one frequency response parameter for a predetermined time. According to another embodiment, the measuring apparatus continuously applies further test signals and measures the corresponding at least one frequency response parameter until the measuring apparatus receives a stop signal. The stop signal may according to an embodiment be an external stop signal obtained by an operator of the measuring apparatus.

According to a preferred embodiment of the method, for each frequency values of the first, second or at least one further plurality of frequency values, adjacent frequency values correspond to a different plurality of the first, second or at least one further plurality of frequency values. In other words, the plurality values are nested such that each frequency value which is analyzed during a new frequency sweep is located between frequency values already analyzed during earlier frequency sweeps.

According to a preferred embodiment of the method, adjacent frequency values of the first plurality of frequency values differ by a predetermined frequency value offset. Additionally or alternatively, adjacent frequency values of the second plurality of frequency values differ by a predetermined second frequency value offset. That is, each plurality of frequency values is given by frequency values with a predetermined spacing.

According to a preferred embodiment of the method, the first and/or second frequency value offset, i.e. spacing between adjacent frequency values of the first and second plurality of frequency values, respectively, may be a predetermined fixed value. According to another embodiment, the first frequency value offset and/or the second frequency value offset is given by a respective predetermined, non-trivial function of the frequency. For example, the spacing may logarithmically depend on the frequency. In this case, the frequency values of the first and/or second plurality of frequency values is logarithmically spaced.

According to a preferred embodiment of the method, the first plurality of frequency values and/or the second plurality of frequency values are randomly distributed. The values may be distributed according to any predetermined distribution function, such as a linear distribution, a logarithmic distribution or an exponential distribution. The values may also be distributed according to a distribution centered around a certain frequency range of interest, such as a binomial distribution or Gaussian distribution. The frequency values of the first plurality of frequency values and/or of the second plurality of frequency values may be generated using a random or pseudo-random number generator which generates numbers according to a predetermined probability distribution.

According to a preferred embodiment of the method, the first plurality of frequency values comprises a first predetermined number of frequency values per frequency decade, and the second plurality of frequency values comprises a second predetermined number of frequency values per frequency decade. The frequency values may be distributed according to a predetermined distribution, i.e. by a predetermined fixed (non-random) spacing.

According to a preferred embodiment of the method, the first plurality of frequency values and/or the second plurality of frequency values are logarithmically spaced. Often, knowledge of the at least one frequency response parameter is required on a logarithmic scale.

According to a preferred embodiment of the method, a predetermined number of frequency values is randomly generated for each frequency decade on a logarithmic scale. Requiring that each logarithmic scale comprises the predetermined number of frequency values ensures that sufficient information about the frequency dependence of the at least one frequency response parameter is generated for each frequency decade.

According to a preferred embodiment of the method, the number of frequency values of the second plurality of frequency values is larger than the number of frequency values of the first plurality of frequency values. During the first sweep, the frequency response of the device under test is measured for a relatively low number of frequency values of the first plurality of frequency values which quickly gives a first estimation of the frequency dependence of the at least one frequency response parameter. After this first sweep, a second sweep with a higher number of frequency values is performed which may take longer time in order to improve the first estimation. Generally, for a plurality of test signals or frequency sweeps, the corresponding further plurality of frequency values may be chosen such that the number of its elements is larger than the number of frequency values of the pluralities of frequency values of previous frequency sweeps.

According to a preferred embodiment of the method, the step of applying the first test signal and measuring the at least one frequency response parameter of the device under test for the first plurality of frequency values and the step of applying the test signal and measuring the at least one frequency response parameter of the device under test for the second plurality of frequency values are repeated at least once. More generally, a plurality of test signals is applied to the device under test in consecutive order and the at least one frequency response parameter of the device under test is measured for corresponding pluralities of frequency values lying in corresponding frequency ranges. The frequency ranges at least partially overlap with each other and the frequency values at least partially differ from each other. After the last test signal of the plurality of test signals is applied to the device under test, the method repeats, i.e. the first test signal is again applied to the device under test and the at least one frequency response is measured for the corresponding first plurality of frequency values lying in the first frequency range. The newly measured values of the at least one frequency response parameter may override the already existing values of the at least one frequency response parameter. In this way, the method may adapt to changing operating conditions of the device under test.

According to a preferred embodiment of the method, the at least one frequency response parameter comprises at least one of a gain value and a phase value corresponding to the frequency response of the device under test to the first test signal and second test signal. The at least one frequency response parameter may comprise scattering parameters or S-parameters which are elements of a scattering matrix which describes the behavior of the DUT in response to the test signals. The at least one frequency response parameter may also comprise transmission parameters.

According to a preferred embodiment of the method, the frequency dependency of the at least one frequency response parameter is shown on a display device. Preferably, the frequency dependency is first displayed after measuring the at least one frequency response parameter of the device under test for the first plurality of frequency values. After measuring the at least one frequency response parameter of the device under test for the second plurality of frequency values, the frequency dependence is updated by adding the values of the at least one frequency response parameter for the additional frequency values of the second plurality of frequency values.

According to a preferred embodiment of the method, the display device is adapted to show the frequency dependence of the at least one frequency response parameter with a bode plot. A bode plot or bode diagram refers to the graph of a frequency response of a system. It may be a combination of a bode magnitude plot, expressing the magnitude of the frequency response, and a Bode phase plot, expressing the phase shift. The magnitude of the frequency response may be given in decibels. The bode plot may preferably be given on a logarithmic scale.

According to a preferred embodiment of the method, the frequency dependence of the at least one frequency response parameter which is shown on the display device is updated after each sweep. In particular, the display device may output a first plot based on the at least one frequency response parameter of the device under test which has been measured for the first plurality of frequency values. After applying the second test signal to the device under test, the display device may output a second plot using the at least one frequency response parameter of the device under test which has been measured for the second plurality of frequency values. If at least one additional further test signal is applied to the device under test, the display device may output a respective at least one further plot using the at least one frequency response parameter of the device under test which has been measured for the respective further plurality of frequency values.

According to a preferred embodiment of the method, the frequency dependence of the at least one frequency response parameter is outputted to an external device for further processing. The output may be updated after each sweep.

According to a preferred embodiment of the method, interpolating curves and/or regression curves are computed based on the at least one frequency response parameter of the device under test which has been measured. The computation may be performed after each sweep. The computation may take all already measured values of the at least one frequency response parameter into account. According to further embodiments, the computation may only take values of the at least one frequency response parameter into account which have been measured during the last sweep or during a predetermined number of foregoing sweeps.

According to a preferred embodiment the measuring apparatus comprises a display device adapted to display the at least one frequency response parameter as a function of frequency.

According to a preferred embodiment the measuring apparatus further comprises a pseudo-random number generator adapted to generate each plurality of frequency values corresponding to a test signal according to a predetermined probability distribution

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
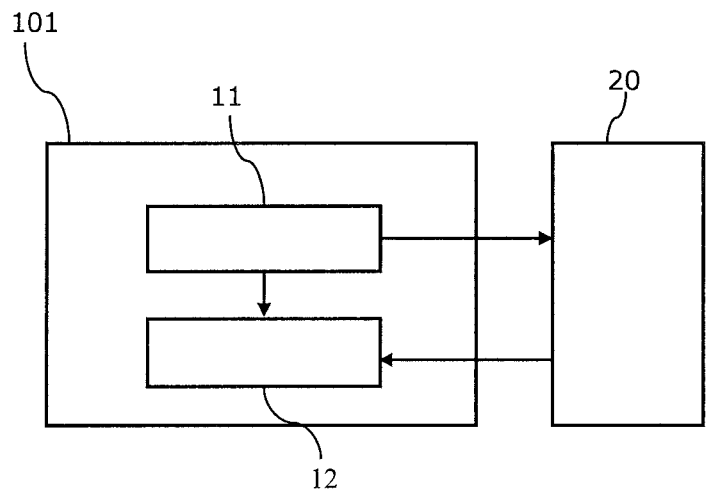
FIG. 1 shows a schematic block diagram of a measuring apparatus for testing a device under test according to an embodiment of the invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

FIG. 1 shows a block diagram of a measuring apparatus 101 for testing a device under test 20. The measuring apparatus 101 may be a network analyzer or a digital oscilloscope. The measuring apparatus 101 comprises a signal generating unit 11 which is adapted to generate test signals for testing the device under test 20.

The device under test 20 may be an active element such as an amplifier or communication device, or a passive electronic component including filtering elements, cables, resistance elements, capacitances or inductances. In particular, the device under test 20 may comprise computing devices such as laptops, notebooks, tablets, smartphones, mobile phones, pagers, PDAs, digital still cameras, digital video cameras, portable media players, gaming consoles, virtual reality glasses, mobile PCs and similar electronic equipment. Further, industrial field devices, radio communication base stations, video and TV devices, audio devices like loudspeakers and similar can be tested.

The device under test 20 may include a processor configured to set the device under test 20 into a test mode with predetermined testing configurations. In addition, a plurality of devices under test 20 may be tested at the same time using a single measuring apparatus 101.

The measuring apparatus 101 may further comprise a user interface having switches, buttons or touch displays allowing the user to interact with the measuring apparatus 101.

The measuring apparatus 101 further comprises a receiving unit 12, particularly a broadband receiving unit which is connected to the device under test 20 and is adapted to receive a response signal from the device under test 20. The receiving unit 12 is further adapted to measure one or more frequency response parameters of the device under test 20 based on the response signal from the device under test 20. The receiving unit 12 may comprise a spectrum analyzer adapted to analyze a spectrum of the response signal of the device under test 20.

The receiving unit 12 may comprise hardware components which may comprise at least one of microcontrollers, central processing units (CPU), memories and storage devices. However, the receiving unit 12 of may also be at least partially software implemented. The receiving unit 12 may comprise a memory which stores instructions. The processor may further execute an operating system that loads and executes the instructions.

The at least one frequency response parameter to be measured by the receiving unit 12 may comprise S-parameters such as at least one of a gain value, a return loss, a voltage standing wave ratio (VSWR), a power supply rejection ratio (PSRR), a common mode rejection ratio (CMRR) and phase parameters.

The measuring apparatus 100 may be adapted to output test signals and receive frequency response parameters of the device under test 20 over a frequency range from 0 Hz (DC) up to an upper frequency limit, wherein the upper frequency limit may be one or several kHz, one or several MHz or one or several GHz. The signal generating unit 11 may comprise a sweep generator which is adapted to provide the test signals by sweeping over a predetermined frequency range. Accordingly, a test signal is applied to the device under test 20 which varies over the predetermined frequency range with a predetermined step-width in order to analyze the frequency response of the device under test 20. The receiving unit 12 receives a response signal from the device under test 20 and calculate at least one frequency response parameter from the response signal for each frequency value. The at least one frequency response parameter is characteristic of the response of the device under test 20 for the specific test signal at the specific frequency value.

The measuring apparatus 101 is adapted to measure the at least one frequency response parameter in several cycles. For each cycle, the signal generating unit 11 provides a test signal by sweeping over a corresponding frequency range. In a first cycle, the signal generating unit 11 generates a first test signal by sweeping over a first plurality of frequency values lying in a first frequency range. The first test signal is applied to the device under test 20. The receiving unit 12 measures the at least one frequency response parameter of the device under test 20 for the first plurality of frequency values lying in the first frequency range. In a second cycle, the signal generating unit 11 generates a second test signal by sweeping over a second plurality of frequency values lying in a second frequency range. The second test signal is applied to the device under test 20. The receiving unit 12 measures the at least one frequency response parameter of the device under test 20 for the second plurality of frequency values lying in the second frequency range. The first frequency range and the second frequency range are chosen in such a way that they at least partially overlap. Further, the first plurality of frequency values is not completely identical with the second plurality of frequency values.

The second plurality of frequency values may correspond to the first plurality of frequency values offset by a predetermined frequency offset value. The offset may be a predetermined fixed number. The offset may also be a predetermined, nontrivial function of the frequency. The first and second plurality of frequency values may be logarithmically spaced.

The number of elements of the first plurality of frequency values may be equal to the number of elements of the second plurality of frequency values. Preferably, the number of elements of the second plurality of frequency values is larger than the number of elements of the first plurality of frequency values. The number of elements of the second plurality of frequency values may be at least by a factor larger than the number of elements of the first plurality of frequency values, for example by a factor of 2, 5, 10 or 100.

The number of elements of the first plurality of frequency values and/or the second plurality of frequency values per frequency decade may be fixed. For example, each plurality of frequency values may comprise 1, 10 or 100 frequency values per frequency decade. The fixed number may also be different for the first plurality of frequency values and the second plurality of frequency values.

The invention is not restricted to two consecutive sweeps. Instead, the signal generating unit 11 may be adapted to generate further test signals and apply the further test signals to the device under test 20. Each further test signal corresponds to a respective further plurality of frequency values lying in a respective further frequency range. Each frequency range preferably overlaps with at least one of the other frequency ranges corresponding to different sweeps. The frequency ranges may also all have at least one common overlap in the frequency domain. Preferably, the frequency values are nested in the sense that each frequency value corresponding to a certain sweep is adjacent to frequency values corresponding to different sweeps.

The measuring apparatus 101 may be adapted to repeat the testing after a predetermined number of sweeps. For example, after applying the second test signal, the signal generating unit 11 may again apply the first test signal. As another example, in case there are further test signals in addition to the first test signal and second test signal, after applying the last one of the further test signals to the device under test, the signal generating unit 11 may again apply the first test signal. The values of the at least one frequency response parameter measured during repetition may be used to override the values of the at least one frequency response parameter obtained during earlier measurements.

The receiving unit 12 may also be adapted to compute quantities characteristic of the device under test 20 from the at least one frequency response parameter which has been measured for the pluralities of frequency values. For example, the receiving unit 12 may compute an interpolating function or regression curve based on the measured values of the at least one frequency response parameter. The computed quantity can be outputted to an external device for further processing.

Figure 2:
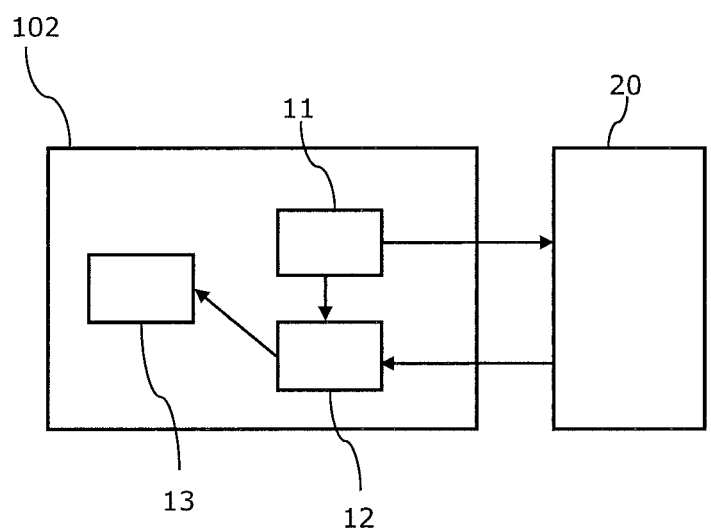
FIG. 2 shows a schematic block diagram of a measuring apparatus for testing a device under test according to another embodiment of the invention.

FIG. 2 shows a schematic block diagram of a measuring apparatus 102. The measuring apparatus 102 comprises a signal generating unit 11 and a receiving unit 12 which may be configured as described above for the measuring apparatus 101 in FIG. 1.

In addition, the measuring apparatus 102 comprises a display device 13 for displaying information to a user of the measuring apparatus 102. The display device 13 is adapted to output the at least one frequency response parameter in the frequency-domain. Preferably, the display device 13 displays a bode plot, in particular a bode magnitude plot, expressing the magnitude of the frequency response, and a bode phase plot, showing the phase of the frequency response.

The display device 13 may update the displayed graph after each sweep. That is, a first plot may be displayed after the receiving unit 12 has measured the at least one frequency response parameter for the first plurality of frequency values. After the receiving unit 12 measures the at least one frequency response parameter for the second plurality of frequency values, the displayed graph is updated by including both the values of the at least one frequency response parameter obtained during the first sweep, i.e. corresponding to the first plurality of frequency values, and the values of the at least one frequency response parameter obtained during the second sweep, i.e. corresponding to the second plurality of frequency values.

Figure 3:
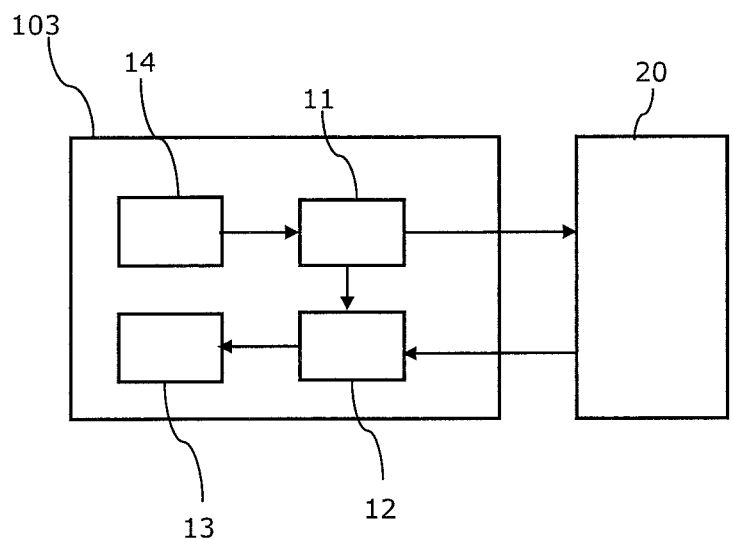
FIG. 3 shows a schematic block diagram of a measuring apparatus for testing a device under test according to yet another embodiment of the invention.

FIG. 3 shows a schematic block diagram of a measuring apparatus 103. The measuring apparatus 103 comprises a signal generating unit 11, a receiving unit 12 and a display device 13 which may be configured as described above for the measuring apparatus 101 and 102 depicted in FIGS. 1 and 2. In addition, the measuring apparatus 103 comprises a random number generator 14 which is adapted to generate random or pseudo-random numbers. The random number generator 14 may be a hardware random-number generator or may comprise a computing device adapted to generate pseudo-random numbers based on an algorithm. The random number generator 14 is coupled to the signal generating unit 11. The signal generating unit 11 uses the random or pseudo-random numbers determining the frequency values of each of the pluralities of frequency numbers. The number of frequency values may be fixed for each frequency decade. The random number generator 14 may generate the random or pseudo-random numbers according to a predetermined probability distribution. In particular, the frequency values determined based on the random or pseudo-random numbers may be logarithmically distributed.

Figure 4:
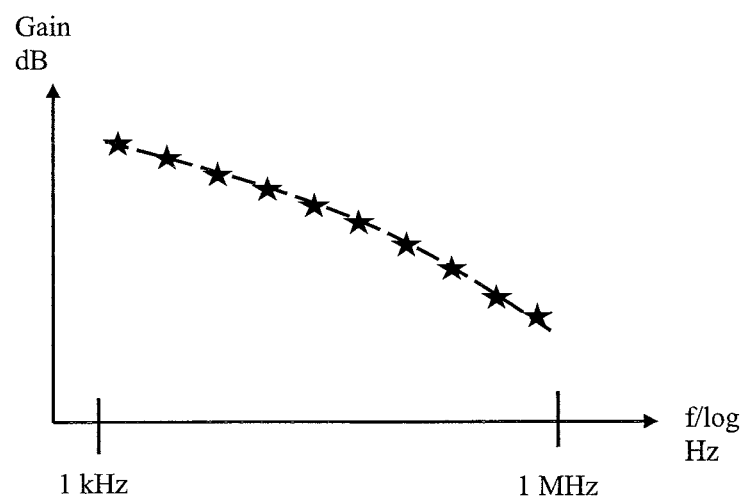
FIG. 4 shows values of a frequency response parameter for a first plurality of frequency values measured after a first sweep.

FIG. 4 shows a schematic plot of a gain value which is one example of a frequency response parameter. The gain value corresponding to the frequency response of the device under test 20 to the first test signal for each frequency value corresponding to the first plurality of frequency values is measured by the receiving unit 12. The measured gain values are shown on a logarithmic scale as functions of the frequency. In addition to the measured gain values (depicted as stars), a regression curve is computed by the receiving unit 12 and is displayed.

Figure 5:
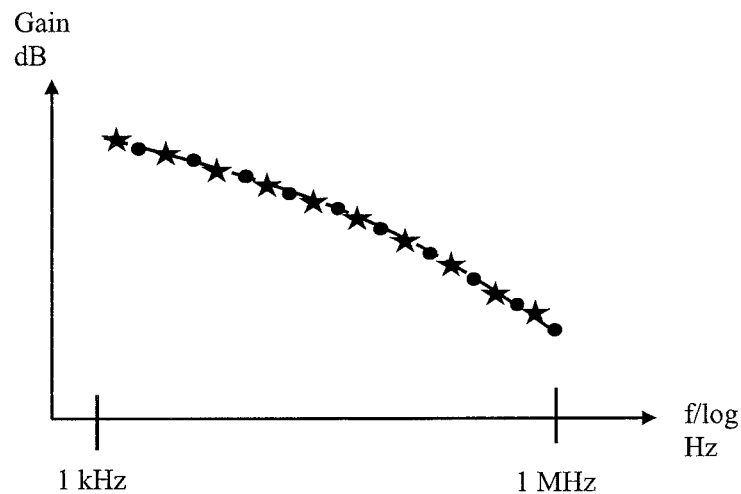
FIG. 5 shows values of the frequency response parameter for a first and a second plurality of frequency values measured after a first and a second sweep.

FIG. 5 shows a schematic plot of the gain value after a second sweep. In addition to the measured gain values obtained based on the response to the first test signal, further gain values are measured by the receiving unit 12 in response to the second test signal. The further gain values (depicted as circles) are shown together with the gain values obtained during the first sweep. The regression curve is updated based on the additional further gain values.

The schematic plots shown in FIGS. 4 and 5 are examples of a possible output of a display device 13. In addition to a plot of the gain value, the output may also comprise the frequency dependence of further frequency response parameters, such as a phase value.

Figure 6:
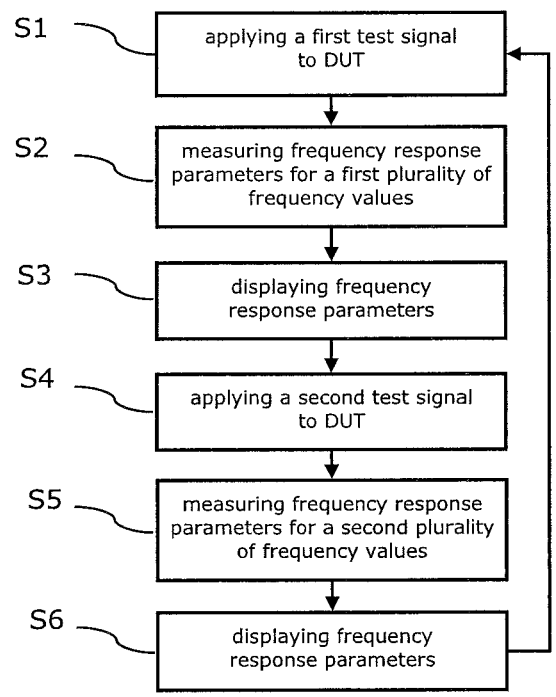
FIG. 6 shows a flow diagram illustrating a method for testing a device under test according to an embodiment of the invention.

FIG. 6 shows a flow diagram illustrating a method for testing a device under test 20. In a first step S1, a first test signal is applied to the device under test 20 by a measuring apparatus 101-103. The method can be performed by any of the above-described measuring apparatuses 101-103. The first test signal corresponds to a first sweep over a first frequency range.

In a second step S2, one or more frequency response parameters are measured for frequency values corresponding to a first plurality of frequency values corresponding to the first sweep. The frequency response parameters preferably comprise S-parameters, in particular gain values, return loss values, VSWR values, PSRR values, CMRR values and phase parameters.

In a third method step S3, the measured values of the at least one frequency response parameter are displayed on a display device 13. In addition to the values of the frequency response parameter measured for the first plurality of frequency values also an interpolating curve and/or a regression curve may be outputted on the display device 13.

In a fourth method step S4, a second test signal is applied to the device under test 20. The second test signal corresponds to a second sweep over a second frequency range. The first frequency range at least partially overlaps with the second frequency range.

In a fifth method step S5, the at least one frequency response parameter is measured for a second plurality of frequency values corresponding to the second sweep. The frequency values of the second plurality of frequency values are at least partially different from the frequency values of the first plurality of frequency values.

In a second method step S6, all values of the at least one frequency response parameter obtained during the first and second sweep are displayed on the display device 13. In other words, the part outputted by the display device 13 is updated based on the values of the frequency response parameter obtained during the second sweep.

In addition, values of the frequency response parameter measured during the first and second sweep may be outputted to an external device for further processing.

The method steps S1 to S6 may be repeated in order to generate new values of the frequency response parameter which can be used to update or override the already existing values of the frequency response parameter.

Figure 7:
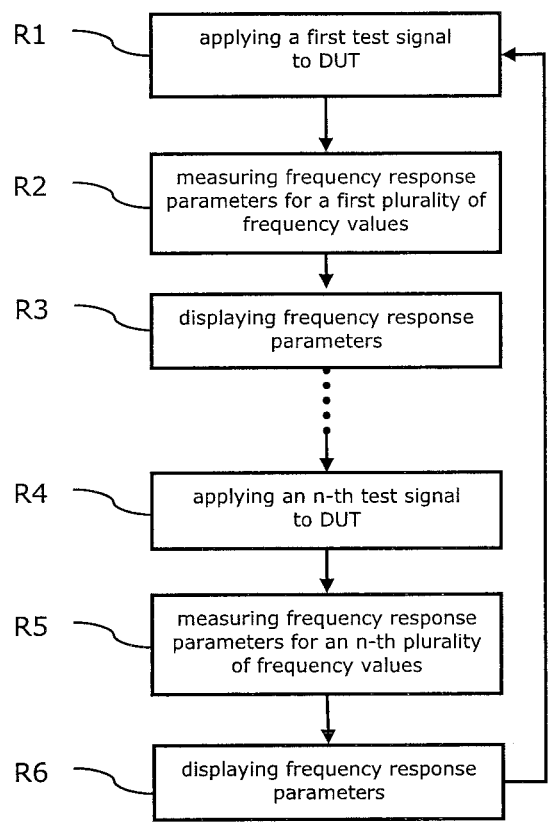
FIG. 7 shows a flow diagram illustrating a method for testing a device under test according to a further embodiment of the invention.

FIG. 7 shows a flow diagram illustrating a method for testing a device under test 20. The method shown in FIG. 7 differs from the method shown in FIG. 6 in that a predetermined number n of frequency sweeps is performed, with n>2. In a first method step R1, a first test signal is applied to the device under test 20. In a second method step R2, one or more frequency response parameters corresponding to the response of the device under test 20 is measured for a first plurality of frequency values lying in a first frequency range. In a third method step R3, the frequency dependence of the frequency response parameters is displayed. In next method steps, further test signals are applied during second to (n-1)-th sweeps to the device under test 20 and the one or more frequency response parameter corresponding to the response of the device under test 20 are measured for respective further pluralities of frequency values. After each sweep, the displayed frequency dependence of the frequency response parameters is updated. A test signal during an n-th sweep is applied to the device under test 20, step R4, and the at least one frequency response parameter is measured for an n-th plurality of frequency values, step R5. The displayed plot is again updated based on the values of the frequency response parameter obtained during the n-th sweep. The method can again be repeated, i.e. the first test signal can again be applied to the device under test 20, step R1.

Summarizing, the invention relates to testing of a device under test 20 using a plurality of test signals. Respective frequency ranges are swept and the response of the device under test 20 is analyzed in order to measure frequency response parameters corresponding to frequency values lying in a respective frequency range. For each sweep, the at least one frequency response parameter is measured for at least partially different frequency values. Therefore, the measurement can be quickly realized after the first sweep. After the following sweeps, a more precise measurement plot can be presented to the user.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

The invention claimed is:

1. A method for testing a device under test, comprising the steps of:
   (a) applying, by means of a measuring apparatus, in a first frequency sweep a first test signal to the device under test, measuring, by the measuring apparatus, a value of at least one frequency response parameter of the device under test for each of a first plurality of frequency values lying in a first frequency range, and displaying, on a display device, a first plot, using the at least one frequency response parameter measured for the first plurality of frequency values;
   (b) applying, by means of the measuring apparatus, in a second frequency sweep a second test signal to the device under test, measuring, by the measuring apparatus, a value of the at least one frequency response parameter of the device under test for each of a second plurality of frequency values lying in a second frequency range to increase a resolution of a frequency dependence of the at least one frequency response parameter, and displaying, on the display device, a second plot, using the at least one frequency response parameter measured for the second plurality of frequency values; and
   (c) applying, by means of the measuring apparatus, in at least one further frequency sweep at least one further test signal to the device under test, measuring, by the measuring apparatus, a value of the at least one frequency response parameter of the device under test for each of at least one further plurality of frequency values lying in at least one further frequency range to further increase the resolution of an obtained frequency dependence of the frequency response parameter, and displaying, on the display device, an at least one further plot, using the at least one frequency response parameter measured for the at least one further plurality of frequency values;
   wherein the first, second and at least one further frequency ranges at least partially overlap with each other, and wherein the first, second, and at least one further plurality of frequency values at least partially differ from each other;
   (d) wherein the steps of applying the first, second and at least one further test signal, steps (a) through (c), are repeated at least once; and wherein a newly measured set of values of the at least one frequency response parameter are used to update an already measured set of values of the at least one frequency response parameter; and
   wherein, for each frequency sweep of the second frequency sweep and the at least one further frequency sweep, a number of a corresponding plurality of frequency values is larger than a number of the plurality of frequency values of previous frequency sweeps.

2. The method according to claim 1, wherein, for each frequency values of the first, second or at least one further plurality of frequency values, an adjacent set of frequency values correspond to a different plurality of the first, second or at least one further plurality of frequency values.

3. The method according to claim 1, wherein an adjacent set of frequency values of the first plurality of frequency values differ by a predetermined first frequency value offset, and wherein the adjacent set of frequency values of the second plurality of frequency values differ by a predetermined second frequency value offset.

4. The method according to claim 3, wherein the first frequency value offset and the second frequency value offset are given by predetermined, nontrivial functions of the frequency.

5. The method according to claim 1, wherein the first plurality of frequency values and the second plurality of frequency values are randomly distributed.

6. The method according to claim 1, wherein the first plurality of frequency values comprises a first predetermined number of frequency values per frequency decade, and wherein the second plurality of frequency values comprises a second predetermined number of frequency values per frequency decade.

7. The method according to claim 1, wherein the first plurality of frequency values and/or the second plurality of frequency values are logarithmically spaced.

8. The method according to claim 1, wherein the at least one frequency response parameter comprises at least one of a gain value and a phase value corresponding to the frequency response of the device under test to the first test signal and to the second test signal.

9. A measuring apparatus for testing a device under test, comprising:
- a signal generating unit adapted to generate a plurality of test signals and apply the plurality of test signals in consecutive order to the device under test;
- a receiving unit, adapted to receive in response of the device under test to each of the plurality of test signals a value of at least one frequency response parameter of the device under test for each frequency value of a plurality of frequency values corresponding to the respective test signal selected from the plurality of test signals, wherein each plurality of frequency values is lying in a respective frequency range, wherein the frequency ranges corresponding to the plurality of test signals at least partially overlap with each other, and wherein the plurality of frequency values corresponding to the plurality of test signals differ at least partially from each other, wherein said plurality of test signals comprise a first test signal corresponding to a first frequency sweep, a second test signal corresponding to a second frequency sweep and at least one further test signal corresponding to at least one further frequency sweep,
- a display device adapted to display, after the first frequency sweep, a first plot, using the at least one frequency response parameter measured during the first frequency sweep, adapted to display, after the second frequency sweep, a second plot, using the at least one frequency response parameter measured during the second frequency sweep, and adapted to display, after the at least one further frequency sweep, an at least one further plot, using the at least one frequency response parameter measured during the at least one further frequency sweep;
- wherein signal generating unit is adapted to repeat generating the first, second and at least one further test signal at least once;
- wherein the receiving unit is adapted to use a newly measured set of values of the at least one frequency response parameter to update an already set of measured values of the at least one frequency response parameter; and
- wherein, for each frequency sweep of the second frequency sweep and the at least one further frequency sweep, a number of the corresponding plurality of frequency values is larger than a number of the plurality of frequency values of previous frequency sweeps.

10. The measuring apparatus according to claim 9, further comprising a pseudo-random number generator adapted to generate each plurality of frequency values corresponding to a test signal according to a predetermined probability distribution.

* * * * *